(12) United States Patent
Tobita

(10) Patent No.: US 6,652,958 B2
(45) Date of Patent: Nov. 25, 2003

(54) THERMALLY CONDUCTIVE POLYMER SHEET

(75) Inventor: Masayuki Tobita, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 57 days.

(21) Appl. No.: 09/977,215

(22) Filed: Oct. 16, 2001

(65) Prior Publication Data

US 2002/0090501 A1 Jul. 11, 2002

(30) Foreign Application Priority Data

Oct. 19, 2000 (JP) ........................................ 2000-319844

(51) Int. Cl.[7] ............................................... B32B 27/04
(52) U.S. Cl. ..................... 428/298.1; 428/215; 428/375; 428/359; 428/364; 428/297.4; 428/327; 428/332
(58) Field of Search ................. 428/329, 323, 428/375, 215, 359, 364, 372, 401, 297.4, 298.1, 299.1, 327, 332; 439/91

(56) References Cited

U.S. PATENT DOCUMENTS 4,838,347 A * 6/1989 Dentini et al. ............... 165/185
4,960,612 A * 10/1990 Dentini et al. ................. 427/47

FOREIGN PATENT DOCUMENTS

| EP | 1041627 | 4/2000 |
|---|---|---|
| JP | 9283145 | 10/1997 |
| JP | 09-283955 | 10/1997 |
| JP | 2000-195998 | 7/2000 |
| JP | 2000195998 | * 7/2000 |

* cited by examiner

Primary Examiner—Merrick Dixon
(74) Attorney, Agent, or Firm—Nath & Associates PLLC; Harold L. Novick

(57) ABSTRACT

A thermally conductive polymer sheet includes a polymer matrix and graphitized carbon fibers as a thermally conductive filler. The graphitized carbon fibers are formed by spinning, infusibilization, carbonization, pulverized mesophase pitch before graphitizing the mesophase pitch. The graphitized carbon fibers have a coating layer of ferromagnetic material on their surface. The application of magnetic field to the coating layer allows the fibers to be oriented to be perpendicular to the sheet. Preferably, by X-ray diffractometry, the graphitized carbon fibers have an interplanar spacing (d002) of graphite planes of less than 0.3370 nm and a ratio (P101/P100) of diffraction peak (101) to diffraction peak (100) of at least 1.15. The ferromagnetic material is preferably at least one of a metal, an alloy, or a compound selected from the group consisting of nickel, cobalt and iron.

11 Claims, 3 Drawing Sheets

THERMALLY CONDUCTIVE POLYMER SHEET

BACKGROUND OF THE INVENTION

The present invention relates to a thermally conductive polymer sheet that has excellent thermal conductivity. More particularly, the invention relates to a thermally conductive polymer sheet including specific graphitized carbon fibers for effectively diffusing heat from a variety of components of electronic hardware such as semiconductor elements, a power supply, a light source, and other parts.

With recent advancements, miniaturization, and lightening of electronic hardware, semiconductor packages have become more compact and more highly integrated and operated at higher speed. Therefore, heat generated by the electronic hardware is a very important issue. Generally, to remove the heat from heat-generating components, a sheet material made of a thermally conductive polymer composition is placed between the heat source and a radiator or between the heat source and a metal heat-transfer plate.

Such polymer compositions include a polymer matrix such as resin and rubber and a filler that has high thermal conductivity in the polymer matrix. Possible fillers include metal oxide, metal nitride, metal carbide, and metal hydroxide such as aluminum oxide, boron nitride, aluminum nitride, silicon nitride, magnesium oxide, zinc oxide, silicon carbide, quartz, and aluminum hydroxide. However, such compositions do not necessarily have sufficient thermal conductivity.

To improve thermal conductivity, various thermally conductive compositions that are filled with carbon fibers or graphite powders of high thermal conductivity have been proposed.

Japanese Unexamined Patent Publication No. 9-283955 discloses a thermally conductive sheet in which graphitized carbon fibers of particular aspect ratio are dispersed in a polymer such as silicone.

In Japanese Unexamined Patent Publication No. 2000-195998, we disclosed a polymer sheet that has good thermal conductivity, a method for producing the sheet, and a semiconductor device having the sheet that achieves a good heat transfer. The sheet is a silicon rubber sheet and it includes pitch-based carbon fibers that are coated with ferromagnetic material and oriented in a certain direction.

Advanced electronic parts such as a semiconductor element generate a large amount of heat. This may lead to various problems such as acceleration of electrochemical migration, development of corrosion at wiring or a pad, cracks or breakdown in a component due to thermal stress, reliability or durability loss of electronic parts due to detachment of jointed surfaces of components. Therefore, there is a need for a composition which has much higher thermal conductivity. The thermal conductivities of conventional thermally conductive compositions as described above are inadequate.

For example, Japanese Unexamined Patent Publication No. 9-283955 discloses a graphitized carbon fiber that serves as a thermally conductive filler. The graphitized carbon fiber is made by carbonizing, graphitizing, and pulverizing raw carbon fiber. After the pulverization, cracks occur in the axial direction of the fiber. A condensation polymerization reaction and a cyclization reaction during graphitization are slow to proceed. In addition, the ratio of the cross-sectional area of the cracked surfaces of the pulverized fibers to the total cross-sectional area is large. Therefore, thermal conductivity of the resulting thermally conductive sheet is inadequate.

In addition, in relation with miniaturization and lightening of electronic parts, a thermally conductive molded article which has an excellent thermal conductivity in a certain direction is desired. For example, a thermally conductive polymer sheet that is placed between electronic parts of a semiconductor device requires high thermal conductivity in the direction perpendicular to the sheet.

BRIEF SUMMARY OF THE INVENTION

An object of the present invention is to provide a thermally conductive polymer sheet that can diffuse a large amount of heat from electric or electronic parts and that has good thermal conductivity in the direction perpendicular to the sheet.

A thermally conductive polymer sheet includes a polymer matrix and graphitized carbon fibers, which are a thermally conductive filler. The fibers are obtained by spinning, infusibilizing, carbonizing, pulverizing, and then graphitizing mesophase pitch. The fibers have a coating layer of a ferromagnetic material, The fibers are oriented to be perpendicular to the sheet.

Other aspects and advantages of the invention will become apparent from the following description, taken in conjunction with the accompanying drawings, illustrating by way of example the principles of the invention.

BRIEF DESCRIPTION OF THE SEVERAL VIEWS OF THE DRAWING

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
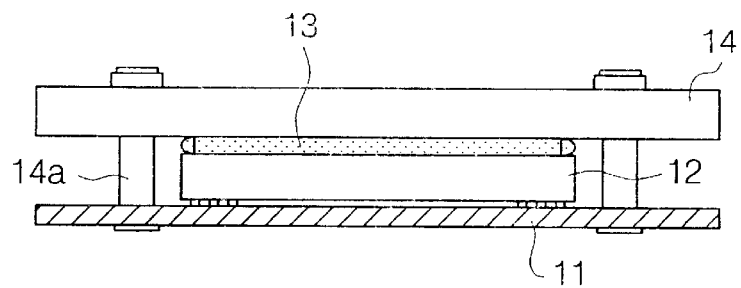
FIG. 1 is a partial sectional view of one application of a thermally conductive polymer sheet of the present invention.

Embodiments of the present invention are described in detail below. Throughout the description, the word "axial" means the direction in which the fibers extend.

A thermally conductive polymer sheet of the present invention includes a polymer matrix and graphitized carbon fibers as a thermally conductive filler. The graphitized carbon fibers are made from a mesophase pitch. The mesophase pitch is spun, infusibilized, carbonized, pulverized, and graphitized. A ferromagnetic coating layer is formed on the graphitized carbon fibers. The placement of the coating layer in the magnetic field orients the graphitized carbon fibers in the direction perpendicular to the sheet.

Graphitized Carbon Fibers

First of all, graphitized carbon fibers, which are used as a thermally conductive filler, are explained.

The material of the graphitized carbon fibers includes condensed polycyclic hydrocarbon compounds such as naphthalene and phenanthrene, PAN (polyacrylonitrile), and condensed heterocyclic compounds such as a petroleum pitch and a coal-tar pitch. The material is preferably an optically anisotropic mesophase pitch. Pitch molecules are oriented in the axial direction of the spun fibers in the spinning process described below, so that the resultant graphitized carbon fibers have good thermal conductivity in the axial direction. Although the mesophase pitch may take any form as long as it is spinnable, a 100% pure mesophase pitch is most preferred in terms of thermal conductivity, spinning and stability of product quality.

The graphitized carbon fibers are preferably produced by spinning, infusibilizing, carbonizing, pulverizing or cutting the fibers in a predetermined particle size, and graphitizing them into the graphitized carbon fibers. The carbonization is conducted before the pulverization or the cutting. This prevents axial cracks of the fibers after pulverization or cutting. Exposure of new graphite planes after pulverization facilitates condensation polymerization reaction and cyclization reaction during subsequent graphitization. Thus, highly thermally conductive graphitized carbon fibers are produced.

As in a conventional way, if the spun fibers are graphitized at high temperature before the pulverization, cracks are likely to occur along the graphite planes that develop in the axial direction of the fibers. The ratio of the cross-sectional area of the cracked surfaces of the pulverized fibers to a total cross-sectional area becomes large. This prevents thermal conduction and is undesirable.

The graphitized carbon fibers specifically take the form of fiber, including a pulverized product or a cut product that keeps the fibrous form. However, other forms such as a scale, a whisker, a micro coil, and a nanotube are also applicable.

The diameter of the graphitized carbon fibers is preferably 5–20 $\mu$m, more preferably 5–15 $\mu$m, and most preferably 8–12 $\mu$m. The fibers that have a diameter of 5–20 $\mu$m are easily produced industrially. The sheet formed of such fibers has high thermally conductivity. The fiber diameters smaller than 5 $\mu$m or larger than 20 $\mu$m decrease the productivity of the fibers.

The average particle size of the graphitized carbon fibers is preferably 10–500 $\mu$m, more preferably 15–200 $\mu$m, and most preferably 15–100 $\mu$m. When the average particle size of each fiber is smaller than 10 $\mu$m, the contact of graphitized carbon fibers in the polymer matrix is reduced and a heat transfer becomes insufficient. This reduces the thermal conductivity of the resultant polymer sheet. When the average particle size is larger than 500 $\mu$m, the graphitized carbon fibers are too bulky to be mixed in the polymer matrix at high concentration, which is undesirable. The average particle size can be calculated from the particle size distribution by laser diffraction model.

From X-ray diffractometry, it is preferred that the graphitized carbon fibers have an interplanar spacing (d002) of graphite planes of less than 0.3370 nm and a ratio (P101/P100) of diffraction peak (101) to diffraction peak (100) of at least 1.15 as structural parameters.

In the X-ray diffractometry, a diffraction pattern of the carbon fibers is measured by using CuK alpha as a X-ray source and highly purified silicon as a standard material. The interplanar spacing (d002) is calculated from the peak position and half-value width of the (002) diffraction pattern. The peak ratio (P101/P100) is determined through a procedure comprising drawing a base line on the obtained diffraction pattern diagram, measuring the heights of diffraction peak (101))(2$\theta$≈44.5 degrees) and diffraction peak (100)) (2$\theta$≈42.5 degrees) from the base line and calculating the quotient of the height of diffraction peak (101) divided by the height of diffraction peak (100).

When the interplanar spacing (d002) 0.3370 nm or greater or the ratio (P101/P100) is less than 1.15, the thermally conductive polymer sheet has inadequate thermal conductivity. Although the reason for this has not been revealed, it is supposed that the thermally conductive polymer sheet of the present invention wherein the graphitized carbon fibers are magnetically oriented in the direction perpendicular to the sheet has a thermal passage which has strong relation with the microstructure of the graphitized carbon fibers. The lower limit of the interplanar spacing (d002) is a theoretical value of 0.3354 nm and the upper limit of the ratio (P11/P100) is 3.

The thermal conductivity of the graphitized carbon fibers in the axial direction is not particularly limited. However, to achieve the object of the present invention, the thermal conductivity is preferably at least 400 W/(m·K), more preferably at least 800 W/(m·K), and most preferably at least 1000 W/(m·K).

A Coating Layer

A ferromagnetic coating layer is formed on the graphitized carbon fibers. This layer facilitates the orientation of the fibers in the direction perpendicular to the sheet in the magnetic field.

As for the ferromagnetic coating, nickel-based material such as an nickel alloy, iron-based material such as an iron alloy, iron nitride-based material, ferrite-based material, barium ferrite-based material, cobalt-based material such as a cobalt alloy, manganese-based material such as a manganese alloy, and rare earth metal alloys such as a neodymium-iron-boron alloy or a samarium-cobalt alloy are preferably used because of ease of the orientation in the magnetic field. Particularly, a ferromagnetic coating comprising at least one metal, alloy, or compound that is selected from nickel, cobalt and iron is preferable because it is highly magnetic and orients the graphitized carbon fibers in the polymer matrix easily. With regard to manufacturing, manufacturing costs, and ease of magnetic orientation, nickel-based material and cobalt-based material are preferred. For example, when electroless plating is applied, a nickel-phosphor alloy, a nickel-boron alloy, a cobalt-phosphor alloy, and a cobalt-boron alloy are practical. Further, in terms of electric non-conductance, ferrite-based material is preferred.

The thickness of the ferromagnetic coating layer is not particularly limited but is preferably 0.01–5 $\mu$m. When the coating layer is thinner than 0.01 $\mu$m, occurred magnetism is weak. This makes it difficult to orient the graphitized carbon fibers in a weak magnetic field. When the coating layer is thicker than 5 $\mu$m, the graphitized carbon fibers can be oriented in such weak magnetic field. However, the thermal conductivity of the resultant sheet decreases. With regard to thermal conductivity, manufacturing costs, and the filling efficiency of the fiber in the polymer matrix, the practical thickness of the ferromagnetic coating is 0.05–3 µm and, more preferably, 0.05–2 µm.

An additional coating layer such as a metal layer or a ceramic layer may be provided on the graphitized carbon fibers or the graphitized carbon fibers with the ferromagnetic coating. For example, the additional coating layer of highly thermally conductive metal, alloy, and ceramic such as silver, copper, gold, aluminum oxide, magnesium oxide, zinc oxide, boron nitride, aluminum nitride, silicon nitride, silicon carbide, aluminum hydroxide improves the thermal conductivity of the sheet.

When the ferromagnetic coating is an electroconductive metal such as nickel, an additional coating layer that is made of electric non-conducting ceramic such as aluminum oxide, magnesium oxide, zinc oxide, boron nitride, aluminum nitride, silicon nitride, silicon carbide, and aluminum hydroxide or an additional coating layer that is made of insulative polymer having siloxane bonding is formed on the outermost surface. This allows the resultant sheet to be electrically insulative.

Further, the surface of the graphitized carbon fiber with a ferromagnetic coating layer can be modified with a known coupling agent or a known sizing agent such as silane-containing agent, titanium-containing agent, and aluminum-containing agent. This improves wettability or adhesion of the coating layer to the polymer matrix or the peel strength from the polymer matrix at the interface. This enhances the filling efficiency of the fibers in the polymer matrix and facilitates the magnetic orientation of the fibers. The resultant sheet becomes highly thermally conductive.

Polymer Matrix

The polymer matrix is not limited and selected according to required characteristics or applications such as a shape, hardness, mechanical properties, thermal properties, electrical properties, durability, and reliability of the resultant sheet. Specifically, thermoplastic resin, thermoplastic elastomer, thermosetting resin, and vulcanized rubber are desirable for the polymer matrix due to their molding capability. Thermoplastic resin and thermoplastic elastomer are particularly preferred since they are repeatedly moldable and recyclable.

The thermoplastic resin includes polyethylene, polypropylene, ethylene-α-olefin copolymer such as ethylene-propylene copolymer, polymethylpentene, polyvinyl chloride, polyvinylidene chloride, polyvinyl acetate, ethylene vinyl acetate copolymer, polyvinyl alcohol, polyacetal, fluororesins such as polyvinylidene fluoride and polytetrafluoroethylene, polyethylene terephthalate, polybutylene terephthalate, polyethylene naphthalate, polystyrene, polyacrylonitrile, styrene acrylonitrile copolymer, ABS resin, polyphenylene ether (PPE) resin and modified PPE resin, aliphatic and aromatic polyamides, polyimide, polyamide imide, polymethacrylic acid and polymethacrylates such as polymethyl methacrylate, polyacrylic acids, polycarbonate, polyphenylene sulfide, polysulfone, polyether sulfone, polyether nitrile, polyether ketone, polyketone, liquid crystal polymer, silicone resin, and ionomer.

The thermoplastic elastomer includes repeatedly moldable and recyclable thermoplastic elastomers such as styrene-butadiene or styrene-isoprene block copolymers and hydrogenated polymer thereof, styrene thermoplastic elastomer, olefin thermoplastic elastomer, vinyl chloride thermoplastic elastomer, polyester thermoplastic elastomer, polyurethane thermoplastic elastomer, and polyamide thermoplastic elastomer.

The thermosetting resin includes epoxy resin, polyimide, bis-maleimide resin, benzocyclobutene, phenol resin, unsaturated polyester, diallyl phthalate, silicone resin, polyurethane, polyimide silicone, thermosetting polyphenylene ether resin and modified PPE resin.

The vulcanized rubber and analogues thereof include natural rubber, butadiene rubber, isoprene rubber, styrene-butadiene copolymer rubber, nitrile rubber, hydrogenated nitrile rubber, chloroprene rubber, ethylene-propylene rubber, chlorinated polyethylene, chlorosulfonated polyethylene, butyl rubber and butyl rubber halide, fluorine rubber, urethane rubber, and silicone rubber.

In terms of temperature characteristics such as thermal resistance and electric reliability, the matrix polymer is preferably at least one material selected from the group consisting of silicone rubber, epoxy resin, polyurethane, unsaturated polyester, polyimide, bis-maleimide, benzocyclobutene, fluororesin, polyphenylene ether resin and thermoplastic elastomer. More preferably, the matrix polymer is at least one material selected from the group consisting of silicone rubber, epoxy resin, unsaturated polyester resin, polyimide, polyurethane and thermoplastic elastomer.

In addition, these polymer matrices may become a low-viscosity liquid form when filled with the graphitized carbon fibers or may have decreased viscosity upon melting. This facilitates the orientation control of the fibers in the magnetic field.

In an application for a wiring board where permittivity and dielectric loss tangent are small and frequency characteristic is required, fluororesin, thermosetting polyphenylene ether resin, modified PPE resin, and polyolefin resin are desired.

To obtain a flexible thermally conductive polymer sheet, a polymer matrix such as low-hardness vulcanized rubber and low-hardness thermoplastic elastomer may be used.

To fill a polymer matrix with the graphitized carbon fibers at high density, a polymer matrix or a polymer precursor that is liquid or that has low viscosity in a melted state is preferred.

One or more of the above polymers can be used as appropriate. Further, a polymer alloy formed of a plurality of these polymer materials may be used. The methods of cross-linking thermosetting resin or vulcanized rubber are not limited to thermosetting but include known methods such as light setting and moisture setting.

Thermally Conductive Polymer Sheet

The thermally conductive polymer sheet formed of the compound including the polymer matrix and the graphitized carbon fiber is described.

Each graphitized carbon fiber with a ferromagnetic coating layer is oriented in the direction perpendicular to the sheet. The graphitized carbon fiber has high thermal conductivity in its axial direction and thus exhibits excellent thermal conductivity in the direction perpendicular to the sheet.

The density of the graphitized carbon fibers in the polymer matrix is preferably 5–75% by volume and more preferably 7–60% by volume although it is appropriately determined on the required characteristics of the end product. When the density is less than 5% by volume, the thermal conductivity of the sheet becomes low and heat-dissipating characteristic of the sheet decreases. When the density is greater than 75% by volume, the viscosity of the composition increases so that the orientation of the graphitized carbon fibers in the polymer matrix is difficult. Gas bubbles are inevitably included. To decrease the viscosity of the composition, a volatile organic solvent, low-viscosity softener, or a reactive plasticizer may be added to the composition.

In addition to the graphitized carbon fibers, the thermally conductive polymer composition may include other thermally conductive material, an incombustible agent, a softening agent, a colorant, and a stabilizer as required. Other thermally conductive materials include the following:

- metal and ceramic such as silver, copper, gold, aluminum oxide, magnesium oxide, boron nitride, aluminum nitride, silicon nitride, silicon carbide, and aluminum hydroxide
- metal-coated resin
- conventional graphitized carbon fiber
- non-graphitized carbon fiber
- natural graphite
- synthetic graphite
- mesocarbon micro beads
- whisker-, micro coil- or nanotube-shaped carbon
- diamond powder In an application where electric non-conductance is particularly required for a thermally conductive polymer sheet, an end product, the composition preferably includes at least one electrical insulative thermally conductive filler selected from the group consisting of aluminum oxide, magnesium oxide, boron nitride, aluminum nitride, silicon nitride, silicon carbide and aluminum hydroxide.

The thickness of the sheet is not limited but it is preferably 50 μm–10 μm, and more preferably, 200μm–5 μm. When the thickness is less than 50 μm, the sheet is hard to manufacture and handle. When the thickness is more than 10 mm, thermal resistance becomes great, which is undesirable.

The hardness of the molded article depends on its purpose for use. For stress relaxation and fitting characteristics of the molded article, greater flexibility, or lower hardness, is advantageous. Specifically, the hardness of the molded body is preferably 70 or less using Shore A hardness. More preferably, the hardness is 40 or less using Shore A hardness. Most preferably, the molded body has an Asker C hardness of 30 or less and is a thermally conductive sheet as described below in which a gel silicone rubber or a thermoplastic elastomer is used as polymer matrix.

The thickness of the sheet is not limited but it is preferably 50 μm–10 mm, and more preferably, 200 μm–5 mm. When the thickness is less than 50 μm, the sheet is hard to manufacture and handle. When the thickness is more than 10 mm, thermal resistance becomes great, which is undesirable.

Method for Producing the Thermally Conductive Polymer Sheet

For the method of producing the thermally conductive polymer sheet, a modified method of that described in Japanese Unexamined Patent Publication No. 2000-195998 is simple and desirable. Specifically, external magnetic field is applied to a composition that includes graphitized fibers and a polymer matrix to orient the fibers in the direction perpendicular to the potential sheet. Then the composition is molded into a sheet. The longitudinal direction of the fibers is parallel to the direction perpendicular to the sheet. Thus, a thermally conductive polymer sheet in which the thermal conductivity in the direction perpendicular to the sheet is drastically improved can be obtained easily.

i. Method for Producing Graphitized Carbon Fibers

The graphitized carbon fibers are made from a mesophase pitch. The graphitized carbon are pulverized or cut products that keep fibrous shapes. The mesophase pitch is spun, infusibilized, carbonized, and pulverized or cut. Then, the pulverized or cut fibers are graphitized to form powdery graphitized carbon fibers.

The methods of melt-spinning the raw pitch include various methods such as melt spinning, melt blowing, centrifugal spinning, and eddy spinning. Among these methods, melt blowing is desirable in terms of productivity at spinning and quality of the resultant graphitized carbon fibers. In melt blowing, threads of carbon fibers are spun at low viscosity, not more than tens of poise, and rapidly cooled down. This facilitates an arrangement of graphite planes parallel with the axis of the fiber.

The diameter of spinning holes in melt blowing is preferably 0.1–0.5 mm, more preferably 0.15–0.3 mm. When the diameter of the holes is over 0.5 mm, the diameter of fibers becomes large, e.g., 25 μm or more, and diameter variations occur. This is undesirable in view of quality control. When the diameter of the holes is smaller than 0.1 mm, the holes tend to clog while spinning. Also, manufacture of spin nozzles is difficult.

For productivity, the spinning rate is preferably at least 500 m/min, more preferably at least 1500 m/min, and most preferably at least 2000 m/min. Although the spinning temperature varies depending on kinds of raw pitch, it is the same as or higher than the softening point of the pitch and below the temperature at which the pitch degenerates. The spinning temperature is generally 300–400 degrees C. and preferably 300–380 degrees C.

The softening point of raw pitch is not necessarily limited. However, in relation to the spinning temperature, lower softening point is advantageous. A lower softening point and faster infusibilizing rate are advantageous in terms of manufacturing costs and quality stability. The softening point of the raw pitch is preferably 230–350 degrees C. and more preferably 250–310 degrees C.

The pitch-based carbon fibers after spinning are infusibilized by ordinary methods. The infusibilization methods include, for example, heating the fibers in an oxidative atmosphere such as carbon dioxide or oxygen, treatment with an aqueous solution of an oxidative acid such as nitric acid and chromic acid, polymerization by light or gammma-rays. A simpler way of infusibilization is heating in air. The heating is conducted up to 350 degree C. at an average rate of increase of preferably at least 3 degree C./min, and more preferably at least 5 degree C./min although the rate slightly varies with different kinds of fibers.

The carbonization includes lightly carbonizing carbon fibers in an inert gas with heat. As used herein, lightly carbonized means that the temperature of the carbon fibers reaches substantially the appropriate temperature for treatment. Specifically, lightly carbonized means that the carbon fibers are subjected to an atmosphere of the treatment temperature for at least ten minutes. The treatment temperature is preferably 250–1500 degrees C. and more preferably 500–900 degrees C.

To pulverize or cut fibers, pulverizing machines such as a Victory mill, a jet mill, and a high-speed rotation mill or cutters for chopping fibers are available. To make the pulverization or cutting effective, it is advantageous if a rotor of each machine that has blades is rotated at high speed to cut the fibers in a direction perpendicular to the fibers. The average particle size of the pulverized or cut fibers is changed by adjusting the rotation number of the rotor or an angle of the blades. Grinding machines such as a ball mill could be used for pulverizing the fibers. However, such machines are undesirable in that they apply perpendicular pressure to fibers, which generates cracks in the axial direction of the fibers.

The pulverization or cutting of the carbon fibers is not limited after the carbonization and may be conducted after the infusibilization or after the graphitization. However, the pulverization or cutting after carbonizing the infusibilized fibers is most preferable.

The infusibilized fibers are lightly carbonized at the temperature of 250–1500 degrees C. before pulverization. This prevents axial cracks of the fibers after pulverization. Exposure of new graphite planes after pulverization facilitates condensation polymerization reaction and cyclization reaction during subsequent graphitization. Thus, a highly thermally conductive polymer composition and a highly thermally conductive molded article are produced. When the temperature is below 250 degree C., carbonization is insufficient. When the temperature is over 1500 degree C., the strength of the carbon fibers becomes too high to conduct pulverization.

As in a conventional way, if the spun fibers are graphitized at high temperature before the pulverization, cracks are likely to occur along the graphite planes that develop in the axial direction of the fibers. The ratio of the cross-sectional area of the cracked surfaces of the pulverized fibers to a total cross-sectional area becomes large. This prevents thermal conduction and is undesirable.

The graphitization process is conducted by heating the pulverized carbon fibers at high temperature in an inert gas. The treatment temperature is preferably at least 2500 degree C., more preferably at least 3000 degree C. This process develops the graphite structure. Graphitization proceeds as the treatment temperature increases. Thus, the resultant graphitized carbon fibers have an increased thermal conductivity in an axial direction of the fiber.

From the process described above, the powdery graphitized carbon fibers that keep fibrous shape are obtained.

ii. Coating with a Ferromagnetic Coating

Next, a ferromagnetic coating layer is formed on the surface of the above-described graphitized carbon fibers.

The coating layer may be formed by various methods such as electroless plating, electroplating, physical vapor evaporation such as vacuum evaporation and sputtering, chemical vapor deposition, spraying, coating, immersion, mechanochemical method in which fine particles are mechanically fixed on the surface of the fibers, and a sol-gel method.

For the purpose of improvement of the surface of the graphitized carbon fibers, the surface of the fibers is preferably treated by activation treatments such as degreasing, washing, oxidation such as electrolytic oxidation, irradiation by ultraviolet rays, corona discharge, plasma treatment, flaming, and ion injection.

iii. Molding

The graphitized carbon fibers with the coating layer are mixed in the polymer matrix with known mixing devices such as a blender, a mixer, a roller, an extruder, shaken, degassed, kneaded to produce a polymer composition. The polymer composition is molded into a sheet to form a thermally conductive polymer sheet.

The method of molding the polymer composition into a sheet is not limited and includes, for example, compression molding, extrusion molding, injection molding, casting molding, blow molding, and calendering molding. When the composition is liquid, it may be processed by painting, printing, dispensing, and potting other than the above methods.

iv. Orientation

To orient the graphitized carbon fibers in the direction perpendicular to the sheet, the polymer composition is placed and permanent magnets or electromagnets are placed on the sides of the composition so that a north pole and a south pole of them face to each other and the magnetic line of force extends toward the direction perpendicular to the potential sheet. After the fibers are fully oriented, the composition is hardened into a sheet by cooling or hardening. Thus, a thermally conductive polymer sheet in which the graphitized carbon fibers are oriented along the magnetic line of force and in the direction perpendicular to the sheet and that exhibit excellent thermal conductivity in that direction is obtained.

A device for producing external magnetic field is not particularly limited. For example, a permanent magnet, an electromagnet, and a coil are preferably used. When the magnetic flux density of the device is 0.05 tesla, or more, the orientation of the fibers can be achieved to obtain the intended highly thermally conductive polymer sheet. The magnetic flux density is preferably 0.1 tesla or more and, more preferably, 0.2 tesla or more. The higher the magnetic flux density is, the more greatly the fibers are oriented.

The magnetic line of force is not necessarily a straight line. The line may be a curved line, a square line, or lines in the at least two directions so long as it can orient the fibers in the direction perpendicular to the sheet. Also, the magnet is not necessarily placed on either side of the sheet. Even a magnet on one side can magnetically orient the fibers in the composition in the direction perpendicular to the sheet.

Embodiments

Some applications of the thermally conductive polymer sheet are explained.

As shown in FIGS. 1–4, a thermally conductive polymer sheet 13 is used as a heat-dissipating member, a heat-transfer member, or a component thereof to dissipate the heat generated from the heating element outside effectively. In electronics, the thermally conductive polymer sheet 13 is placed between the heating element such as a semiconductor element, a power supply, and a light source and a heat-dissipating element such as a radiator.

As shown in FIG. 1, a semiconductor element 12, or Ball Grid Array semiconductor package, is placed on a printed circuit board 11. A radiator 14 is supported by the board 11 via a supporting member 14a to cover the semiconductor element 12. A thermally conductive sheet 13 as described above is placed between the semiconductor element 12 and the radiator 14.

Figure 2:
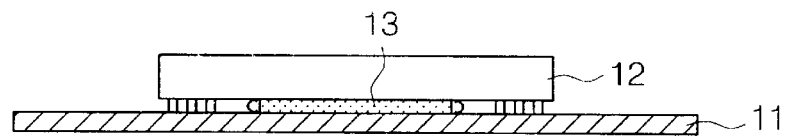
FIG. 2 is a partial sectional view of another application of a thermally conductive polymer sheet of the present invention.

As shown in FIG. 2, the semiconductor element 12, or Chip Size semiconductor package, is placed on the printed circuit board 11. The thermally conductive sheet 13 is placed between the board 11 and the semiconductor element 12.

Figure 3:
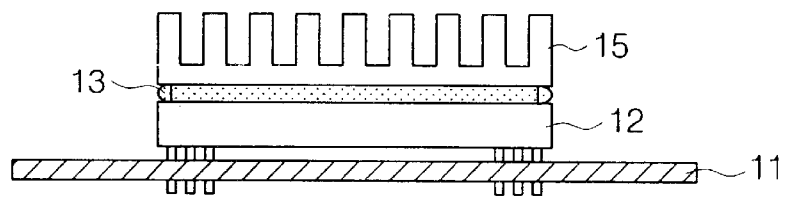
FIG. 3 is a partial sectional view of another application of a thermally conductive polymer sheet of the present invention.

As shown in FIG. 3, the semiconductor element 12, or Pin Grid Array semiconductor package, is placed on the printed circuit board 11. The thermally conductive sheet 13 is mounted on the semiconductor element 12. A heat sink 15 is mounted on the thermally conductive sheet 13. The heat sink 15 has fins on its top.

Figure 4:
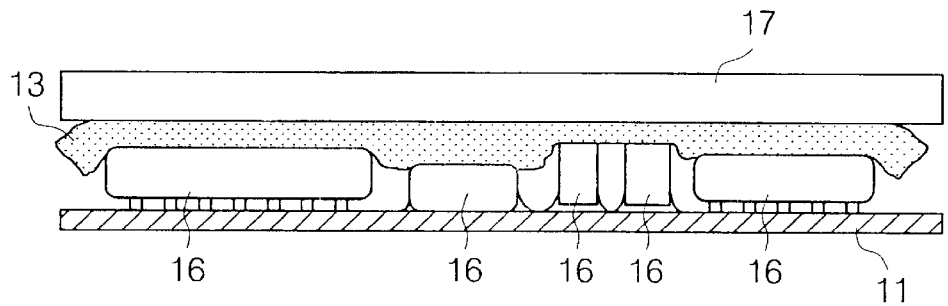
FIG. 4 is a partial sectional view of another application of a thermally conductive polymer sheet of the present invention.

As shown in FIG. 4, packaging parts 16 are provided on the printed circuit board 11. The thermally conductive sheet 13 is placed between the packaging parts 16 and the housing 17.

The sheet 13 has a good thermal conductivity in the direction perpendicular to itself and transfer the heat from the heat-generating members effectively.

Figure 8:
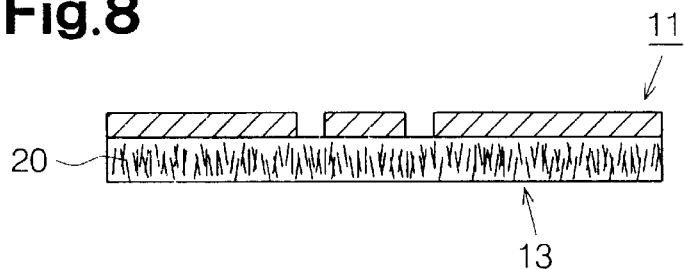
FIG. 8 is a schematic view of a printed circuit board to which the sheet of FIG. 6 is applied.
Figure 9:
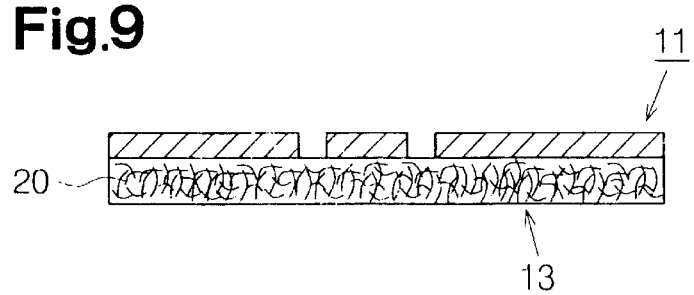
FIG. 9 is a schematic view of a printed circuit board to which the sheet of FIG. 7 is applied.

The sheet 13 may be applied to a heat transfer member such as a printed circuit board 11 as in FIG. 8, a radiation plate, heat-dissipating rubber sheet, semiconductor package parts, a heat sink, a heat spreader, a housing.

The advantages of the above embodiments are described below.

By using mesophase pitch as a raw material of graphitized carbon fibers, the graphitized carbon fibers that has excellent thermal conductivity in the axial direction can be obtained. The thermally graphitized carbon fibers are carbonized and pulverized before being graphitized. Thus, axial cracks of the fibers after the pulverization are prevented. Exposure of new graphite planes upon pulverization facilitates condensation polymerization reaction and cyclization reaction during graphitization at a higher temperature. Thus, a highly thermally conductive fibers and a highly thermally conductive sheet including such fibers are obtained. Therefore, large amounts of heat that generate from electric or electronic parts are diffused effectively.

The graphitized carbon fibers have a diameter of 5–20 μm. This facilitates manufacture of the thermally conductive polymer composition and improves the thermal conductivity of the sheet. The graphitized carbon fibers have an average particle size of 10–500 μm. This allows the fibers to be filled in the polymer matrix at high density and to form the heat transfer pathways. This also improves the thermal conductivity of the sheet.

According to X-ray diffractomerty of the graphitized carbon fiber, and interplanar spacing (d002) between graphite planes is less than 0.3770 nm and a peak ratio (P101/P100) of diffraction peak (101) and diffraction peak (100) is 1.15 or more. This indicates that the thermal conductivity of the sheet is improved.

A ferromagnetic coating layer is formed on the surface of the graphitized carbon fibers. This layer facilitates the orientation of the fibers in the polymer matrix in the magnetic field. therefore, the graphitized carbon fibers are highly oriented in the direction perpendicular to the sheet. The sheet exhibits high thermal conductivity in the axial direction of the fibers. The thermal conductivity of the sheet in the direction perpendicular to it is improved. The ferromagnetic coating layer has a thickness of 0.01–5 μm. This allows the fibers to be oriented at low magnet field and to be filled in the polymer matrix. Thus, a need for an expensive external magnetic field is eliminated. Thus, the sheet that has high thermal conductivity can be manufactured at low costs.

EXAMPLE

The above embodiments will be described by way of examples. The invention is not limited in any way by the examples.

(Sample 1, Graphitized Carbon Fiber)

A petroleum mesophase pitch that is optically anisotropic and has the specific gravity of 1.25 was used as a raw material. A die, which includes the 3 mm wide slits between which passages with 0.2 mm diameter spinning holes are arranged, was used. The mesophase pitch was melted and blown by the heated air out of the slits. The melted pitch was spun at a spinning temperature of 360 degree C. to produce pitch-based fibers having an average diameter of 13 μm.

The spun fibers were collected on the belt as a mat. The mat was heated in the air from a room temperature to 300 degree C. at an average rising rate of 6 degree C./min to infusibilize the fibers. Then the infusibilized fibers were lightly carbodized at 700 degree C. and pulverized with a high-speed rotation mill to form pulverized carbon fibers.

The pulverized fibers were heated in an argon gas up to 2300 degree C., kept at 2300 degree C. for 40 minutes, further heated up to 3100 degree C. at a rising rate of 3 degree C./min, kept at 3100 degree C. for one hour, and cooled down to form graphitized carbon fibers.

The measurements of density, fiber diameter, average particle size, X-ray diffraction parameters, and thermal conductivity in the axial direction of Sample 1 are shown in Table 1. The thermal conductivity of the fibers in the axial direction was measured on the graphitized mat before pulverization under the same condition.

(Sample 2, Graphitized Carbon Fiber)

A petroleum mesophase pitch that is optically anisotropic and has the specific gravity of 1.25 was used as a raw material. A die, which includes the 3 mm wide slits between which passages with 0.2 mm diameter spinning holes are arranged, was used. The mesophase pitch was melted and blown by the heated air out of the slits. The melted pitch was spun at a spinning temperature of 360 degree C. to produce pitch-based fibers having an average diameter of 15 μm.

The spun fibers were collected on the belt as a mat. The mat was heated in the air from a room temperature to 300 degree C. at an average rising rate of 6 degree C./min to infusibilize the fibers. Then the infusibilized fibers were lightly carbodized at 700 degree C. and pulverized with a high-speed rotation mill to form pulverized carbon fibers.

The pulverized fibers were heated in an argon gas up to 2300 degree C., kept at 2300 degree C. for 40 minutes, further heated up to 3100 degree C. at a rising rate of 3 degree C./min, kept at 3100 degree C. for one hour, and cooled down to form graphitized carbon fibers.

The measurements of density, fiber diameter, average particle size, X-ray diffraction parameters, and thermal conductivity in the axial direction of Sample 2 are shown in Table 1.

(Samples 3 and 4, Graphitized Carbon Fibers)

For comparison, commercially available long fibers formed of super-elastic pitch-based graphitized cabon was used. As in Samples 1 and 2, the pulverized fibers of Samples 3 and 4 were pulverized with a high-speed rotation mill to form. Sample 3 was made from the graphitized carbon fibers (the axial thermal conductivity: 600 W/(m·K)) of MITSUBISHI CHEMICAL CORPORATION. Sample 4 was made from the graphitized carbon fibers (the axial thermal conductivity: 1000 W/(m·K)) of Nippon Graphite Fiber Corp.

The measurements of density, fiber diameter, average particle size, X-ray diffraction parameters, and thermal conductivity in the axial direction of Samples 3 and 4 are shown in Table 1. When the graphitized carbon fibers of Samples 3 and 4 were observed under a scanning electron microscope (SEM), it was found that both fibers cracked in the axial direction.

TABLE 1

| | Sample 1 | Sample 2 | Sample 3 | Sample 4 |
|---|---|---|---|---|
| density (g/cm$^3$) | 2.23 | 2.24 | 2.18 | 2.19 |
| fiber diameter (μm) | 8.8 | 9.5 | 9.1 | 9.0 |
| average article size (μm) | 30 | 50 | 30 | 50 |
| X-ray diffraction | | | | |
| parameters | | | | |
| (d002) (nm) | 0.3368 | 0.3358 | 0.3375 | 0.3371 |
| (P101/P100) | 1.20 | 1.37 | 1.04 | 1.09 |
| thermal conductivity (W/(m · K)) | 1000 | 1100 | 600 | 1000 |
| ferromagnetic coating | no | no | no | no |
| type | — | — | — | — |
| thickness (μm) | — | — | — | — |

(Sample 5, Graphitized Carbon Fiber with a Ferromagnetic Coating Layer)

As shown in Table 2, a ferromagnetic coating layer of a nickel-boron alloy formed on the surface of the fibers of Sample 1 to produce Sample 5.

The graphitized carbon fibers of Sample 1 were washed with trichloroethylene, dipped into a hydrochloric acid solution of stannous chloride for 15 minutes, and washed with distilled water. Then the washed fibers were dipped into a hydrochloric acid solution of palladium chloride to activate the surface of the fibers and washed with distilled water.

The fibers were dipped into a plating solution of nickel sulfate-dimethylaminoborane-sodium citrate-ethylene diamine tetraacetatic acid (EDTA). The solution was heated to about 80 degrees C. with stirring. A uniform coating layer of an nickel-boron alloy that has a thickness of 0.2 $\mu$m was formed over the surface of the fibers by electroless plating. The nickel-boron alloy was further magnetized by heating in an argon gas for 20 minutes at 400 degrees C.

(Sample 6, Graphitized Carbon Fiber with a Ferromagnetic Coating Layer)

As shown in Table 2, a ferromagnetic coating layer of a cobalt-phosphor alloy was formed on the surface of the fibers of Sample 1 to produce Sample 6.

The graphitized carbon fibers of Sample 1 were washed with trichloroethylene, dipped into a hydrochloric acid solution of stannous chloride for 15 minutes, and washed with distilled water. Then the washed fibers were dipped into a hydrochloric acid solution of palladium chloride to activate the surface of the fibers and washed with distilled water.

The fibers were dipped into a plating solution of cobalt sulfate-sodium hypophosphite-sodium sulfate-sodium acetate-ammonium sulfate. The solution was heated up to about 90 degrees C. with stirring. A uniform coating layer of an cobalt-pohsphor alloy that has a thickness of 0.15 $\mu$m was formed over the surface of the fibers by electroless plating.

(Samples 7 to 11, Graphitized Carbon Fiber With a Ferromagnetic Coating Layer)

As in the methods in Samples 5 and 6, a ferromagnetic coating layer, the type and the thickness of which being shown in Table 2, was formed on the fibers of Sample 2 to produce Samples 7–9. Similarly, a coating layer was formed on the fibers of Samples 3 and 4 to form Samples 10 and 11, respectively. The "nickel" and "cobalt" in TABLE 2 represent a nickel-boron alloy and a cobalt-phosphor alloy respectively.

TABLE 2

|  | Sample 5 | Sample 6 | Sample 7 | Sample 8 |
|---|---|---|---|---|
| density (g/cm³) | 2.23 | 2.23 | 2.24 | 2.24 |
| fiber diameter ($\mu$m) | 8.8 | 8.8 | 9.5 | 9.5 |
| average article size ($\mu$m) | 30 | 30 | 50 | 50 |
| X-ray diffraction |  |  |  |  |
| parameters | 0.3368 | 0.3368 | 0.3358 | 0.3358 |
| (d002) (nm) | 1.20 | 1.20 | 1.37 | 1.37 |
| (P101/P100) |  |  |  |  |
| thermal conductivity | 1000 | 1000 | 1100 | 1100 |
| (W/(m·K) |  |  |  |  |
| ferromagnetic coating | yes | yes | yes | yes |
| type | Ni | Co | Ni | Ni |
| thickness ($\mu$m) | 0.2 | 0.15 | 0.1 | 0.2 |

|  | Sample 9 | Sample 10 | Sample 11 |
|---|---|---|---|
| density (g/cm³) | 2.24 | 2.18 | 2.19 |
| fiber diameter ($\mu$m) | 9.5 | 9.1 | 9.0 |
| average article size ($\mu$m) | 50 | 30 | 50 |
| X-ray diffraction |  |  |  |
| parameters | 0.3358 | 0.3375 | 0.3371 |
| (d002) (nm) | 1.37 | 1.04 | 1.09 |
| (P101/P100) |  |  |  |
| thermal conductivity | 1100 | 600 | 1000 |
| (W/(m·K)) |  |  |  |
| ferromagnetic coating | yes | yes | yes |
| type | Co | Ni | Ni |
| thickness ($\mu$m) | 0.15 | 0.2 | 0.15 |

Example 1

The 65% by volume of liquid silicone rubber (GE Toshiba Silicones Co., Ltd TSE3070) as a polymer matrix, 25% by volume of the graphitized carbon fibers of Sample 5, and 10% by volume of aluminum oxide powder (SHOWA DENKO K. K. AS-20) were mixed and degassed in vacuum to prepare a polymer composition.

Figure 5A:
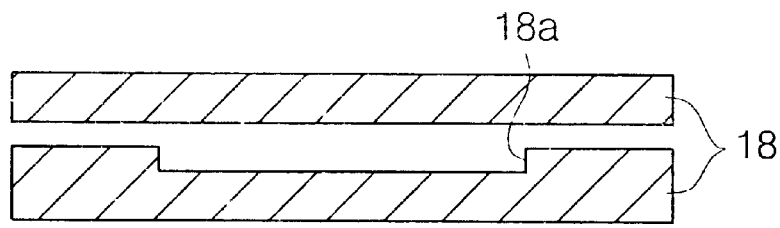
FIGS. 5A, 5B and 5C are schematic sectional views illustrating a method of producing a thermally conductive polymer sheet of the present invention.
Figure 5B:
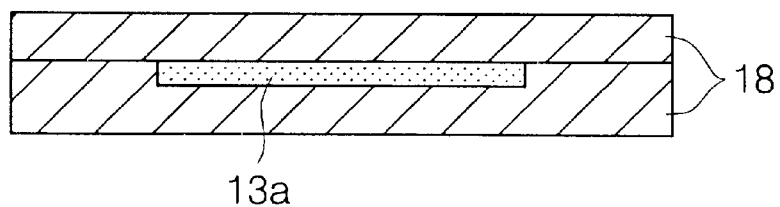
Figure 5C:
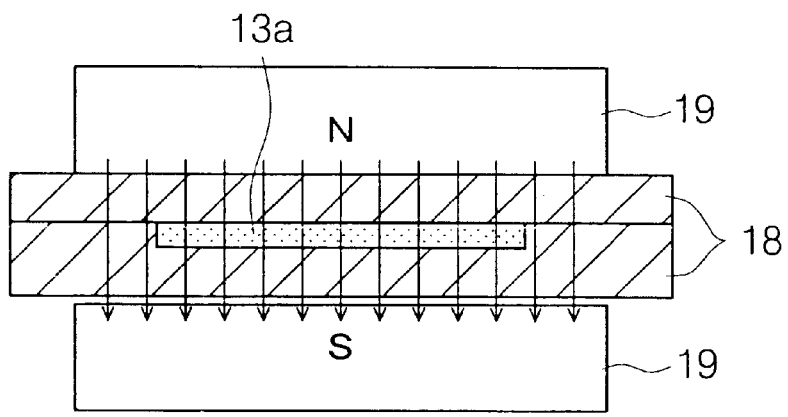

As shown in FIGS. 5A to 5C, the resultant polymer composition was filled in a molding recess 18a of a plate-like metal mold 18. The metal mold 18 was made of aluminum and the size of the metal mold 18 was 20 mm×20 mm. The fibers in the composition were fully oriented in the direction perpendicular to the potential sheet in the magnetic field with a magnet 19. The magnet 19 has a magnetic flux density of 0.5 tesla and has a north pole and a south pole that are faced to each other. Then the composition was hardened by heating to produce a thermally conductive polymer sheet that is flexible and rubber-like and has a thickness of 1 mm.

Figure 6:
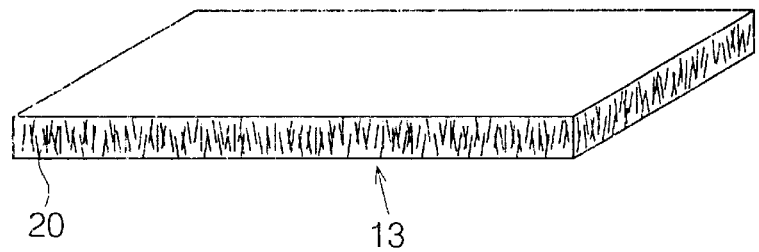
FIG. 6 is a perspective view showing the orientation of graphitized carbon fibers in a thermally conductive polymer sheet of the present invention where the fibers are oriented in the direction perpendicular to the sheet.

The graphitized carbon fibers in the resultant sheet were arranged in the direction perpendicular to the sheet, as shown in FIG. 6. The thermal conductivity in the direction perpendicular to the sheet was 9.1 W/(m·K).

Examples 2–5

As shown in Table 3, the polymer compositions were prepared as in Example 1, except that the graphitized carbon fibers of Samples 6 to 9 were used as graphitized carbon fibers. After the fibers were fully oriented in the magnetic field, the composition was hardened by heating to produce a thermally conductive polymer sheet that is flexible and rubber-like and has a thickness of 1 mm.

The graphitized carbon fibers in the resultant sheet were arranged in the direction perpendicular to the sheet, as shown in FIG. 6. The thermal conductivity in the direction perpendicular to the sheet of each sheet is shown in Table 3.

TABLE 3

|  | Ex. 1 | Ex. 2 | Ex. 3 | Ex. 4 | Ex. 5 |
|---|---|---|---|---|---|
| composition (vol %) |  |  |  |  |  |
| silicone rubber | 65 | 65 | 65 | 65 | 65 |
| graphitized fiber | 25 | 25 | 25 | 25 | 25 |
| Sample type | Sample 5 | Sample 6 | Sample 7 | Sample 5 | Sample 9 |
| aluminum oxide | 10 | 10 | 10 | 10 | 10 |
| magnetic flux | yes | yes | yes | yes | yes |
| magnetic flux density (tesla) | 0.5 | 0.5 | 0.5 | 0.5 | 0.5 |
| orientation | yes | yes | yes | yes | yes |
| thermal conductivity (W/(m·K) | 9.1 | 9.4 | 9.3 | 9.7 | 9.0 |

Comparisons 1–6

As shown in Table 4, the polymer compositions were prepared as in Example 1, except that the graphitized carbon fibers of Samples 1–4, 10, and 11 were used as graphitized carbon fiber. After the fibers were fully oriented in the magnetic field, the composition was hardened by heating to produce a thermally conductive polymer sheet that is flexible and rubber-like and has a thickness of 1 mm.

Figure 7:
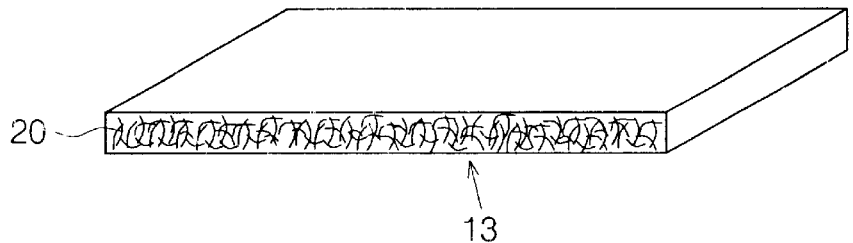
FIG. 7 is a perspective view showing the orientation of graphitized carbon fibers in a conventional thermally conductive polymer sheet where the fibers are not oriented.

The graphitized carbon fibers of Comparisons 1–4 were not arranged in the polymer matrix, as shown in FIG. 7. The graphitized carbon fibers of Comparisons 5 and 6 in the sheet were arranged in the direction perpendicular to the sheet, as shown in FIG. 6. The presence or absence of orientation of the fibers in each sheet and the thermal conductivity in the direction perpendicular to the sheet are shown in Table 4.

TABLE 4

|  | Comp. 1 | Comp. 2 | Comp. 3 | Comp. 4 |
|---|---|---|---|---|
| composition (vol %) | | | | |
| silicone rubber | 65 | 65 | 65 | 65 |
| graphitized fiber | 25 | 25 | 25 | 25 |
| Sample type | Sample 1 | Sample 2 | Sample 3 | Sample 4 |
| aluminum oxide | 10 | 10 | 10 | 10 |
| magnetic flux | yes | yes | yes | yes |
| magnetic flux density (tesla) | 0.5 | 0.5 | 0.5 | 0.5 |
| orientation | no | no | no | no |
| thermal conductivity W/(m · K)) | 2.3 | 2.4 | 2.1 | 2.3 |

|  | Comp. 5 | Comp. 6 |
|---|---|---|
| composition (vol %) | | |
| silicone rubber | 65 | 65 |
| graphitized fiber | 25 | 25 |
| Sample type | Sample 10 | Sample 11 |
| aluminum oxide | 10 | 10 |
| magnetic flux | yes | yes |
| magnetic flux density (tesla) | 0.5 | 0.5 |
| orientation | yes | yes |
| thermal conductivity (W/(m · K)) | 6.5 | 7.1 |

Examples 6–12

As shown in Table 5, a polymer matrix, the graphitized carbon fibers of Sample 8, aluminum oxide powder (SHOWA DENKO K. K., AS-20), and boron nitride powder (DENKI KAGAKU KOGYO KK., SGP) were mixed and degassed in vacuum to prepare a polymer composition. The polymer matrix was selected from liquid epoxy resin (Epoxy Technology, America, Epotech 310), unsaturated polyester (NIPPON SHOKUBAI CO.,LTD, EPOLAC™) or thermoplastic elastomer (Asahi Kasei Corporation, Tuftec™ H1053). In the case of thermoplastic elastomer, a solution in which 100 parts by weight thermoplastic elastomer was dissolved in 400 parts by weight toluene as a solvent was used. The proportion of thermoplastic elastomer in Table 5 is the percentage of solid thermoplastic elastomer after removing toluene.

As shown in FIGS. 5A to 5C, the resultant polymer composition 13*a* was filled in a molding recess 18*a* of a plate-like metal mold 18. The metal mold 18 was made of aluminum and the size of the metal mold 18 was 20 mm×20 mm. The fibers in the composition were fully oriented in the direction perpendicular to the potential sheet in the magnetic field with a magnet 19. The magnet 19 has a magnetic flux density of 0.5 tesla and has a north pole and a south pole that are faced to each other. Then the composition was dried or hardened by heating to produce a thermally conductive polymer sheet that has a thickness of 1 mm.

The graphitized carbon fibers in the resultant sheet were arranged in the direction perpendicular to the sheet, as shown in FIG. 6. The thermal conductivity in the direction perpendicular to the sheet is shown in Table 5.

TABLE 5

|  | Ex. 6 | Ex. 7 | Ex. 8 | Ex. 9 |
|---|---|---|---|---|
| composition (vol %) | | | | |
| liquid epoxy resine | 60 | 0 | 0 | 0 |
| unsaturated PS resin | 0 | 60 | 0 | 65 |
| TP elastomer | 0 | 0 | 60 | 0 |
| graphitized fiber | 30 | 30 | 30 | 25 |
| Sample type | Sample 8 | Sample 8 | Sample 8 | Sample 8 |
| aluminum oxide | 5 | 5 | 5 | 5 |
| boron nitride | 5 | 5 | 5 | 5 |
| magnetic flux | yes | yes | yes | yes |
| magnetic flux density (tesla) | 0.5 | 0.5 | 0.5 | 0.5 |
| orientation | yes | yes | yes | yes |
| thermal conductivity W/(m · K)) | 10.3 | 10.4 | 10.1 | 9.6 |

|  | Ex. 10 | Ex. 11 | Ex. 12 |
|---|---|---|---|
| composition (vol %) | | | |
| liquid epoxy resine | 0 | 0 | 0 |
| unsaturated PE resin | 55 | 55 | 55 |
| TP elastomer | 0 | 0 | 0 |
| graphitized fiber | 35 | 35 | 35 |
| type | Sample 8 | Sample 8 | Sample 8 |
| aluminum oxide | 5 | 5 | 5 |
| boron nitride | 5 | 5 | 5 |
| magnetic flux | yes | yes | yes |
| magnetic flux | 0.5 | 1.0 | 2.0 |
| orientation | yes | yes | yes |
| thermal conductivity (W/(m · K)) | 11.5 | 12.6 | 15.3 |

Comparisons 7–10

As shown in Table 6, similar to Examples 6–12, a polymer matrix, the graphitized carbon fibers of Sample 8, aluminum oxide powder (SHOWA DENKO K. K., AS-20), and boron nitride powder (DENKI KAGAKU KOGYO KK., SGP) were mixed and degassed in vacuum to prepare a polymer composition. The polymer matrix was selected from liquid epoxy resin (Epoxy Technology, America, Epotech 310), unsaturated polyester (NIPPON SHOKUBAI CO.,LTD, EP0LAC™) or thermoplastic elastomer (Asahi Kasei Corporation, Tuftec™ H1053). In the case of thermoplastic elastomer, a solution in which 100 parts by weight thermoplastic elastomer was dissolved in 400 parts by weight toluene as a solvent was used. The proportion of thermoplastic elastomer in Table 5 is the percentage of solid thermoplastic elastomer after removing toluene.

As shown in FIGS. 5A and 5B, the resultant polymer composition 13*a* was filled in a molding recess 18*a* of a plate-like metal mold 18. The metal mold 18 was made of aluminum and the size of the metal mold 18 was 20 mm×20 mm. The composition was dried or hardened by heating without magnetic application to produce a thermally conductive polymer sheet that has a thickness of 1 mm.

The graphitized carbon fibers in the resultant sheet of Comparisons 7–10 were not oriented, as shown in FIG. 7. The presence or absence of orientation of the fibers in each sheet and the thermal conductivity in the direction perpendicular to the sheet are shown in Table 6.

TABLE 6

|  | Comp. 7 | Comp. 8 | Comp. 9 | Comp. 10 |
|---|---|---|---|---|
| composition (vol %) |  |  |  |  |
| liquid epoxy resine | 60 | 0 | 0 | 0 |
| unsaturated PE resin | 0 | 60 | 0 | 65 |
| TP elastomer | 0 | 0 | 60 | 0 |
| graphitized fiber | 30 | 30 | 30 | 25 |
| Sample type | Sample 8 | Sample 8 | Sample 8 | Sample 8 |
| aluminum oxide | 5 | 5 | 5 | 5 |
| boron nitride | 5 | 5 | 5 | 5 |
| magnetic flux | no | no | no | no |
| magnetic flux density (tesla) | 0.0 | 0.0 | 0.0 | 0.0 |
| orientation | 0.0 | 0.0 | 0.0 | 0.0 |
| thermal conductivity (W/(m · K) | 2.5 | 2.4 | 2.5 | 2.2 |

The sheets of Examples 1–5, Comparisons 5 and 6 included the graphitized carbon fibers (Samples 5 to 11) with a ferromagnetic coating layer on their surface so that the fibers were magnetically oriented in the direction perpendicular to the sheet. On the other hand, the sheet of Comparisons 1–4 included the graphitized carbon fibers (Samples 1–4) with no ferromagnetic coating layer so that the fibers were not magnetically oriented. The presence of the ferromagnetic coating layer drastically improved the thermal conductivity in the direction perpendicular to the sheet in the sheets of Examples 1–5 and Comparisons 5 and 6 compared to the sheets of Comparisons 1–4.

The sheets of Comparisons 5 and 6 are the thermally conductive polymer sheets to which the method for producing the sheet described in Japanese Unexamined Patent Publication No. 2000-195998 was applied. The sheets of Comparisons 5 and 6 include the graphitized carbon fibers of Samples 3 and 4 with a ferromagnetic coating layer on their surface (Samples 10 and 11). The presence of the ferromagnetic coating layer allows the fibers to be oriented in the direction perpendicular to the sheet and the thermal conductivity of the sheets of Comparisons 5 and 6 is improved compared with the sheets of Comparisons 3 and 4. However, the fibers of Samples 3 and 4 are the pulverizations of conventional pitch-based graphitized carbon fibers. Such graphitized carbon fibers does not satisfy the requirement as structural parameters by X-ray diffractometry, that is, an interplanar spacing (d002) of graphite planes of less than 0.3370 nm and a ratio (P101/P100) of diffraction peak (101) to diffraction peak (100) of at least 1.15. Therefore the thermal conductivity of resultant sheets was not necessarily sufficient.

The sheets of Examples 6–12 included the graphitized carbon fibers of Sample 8. Such graphitized carbon fibers are formed by spinning, infusibilizing, carbonizing, and pulverizing the mesophase pitch before graphitizing and each fiber has a ferromagnetic coating layer on its surface. The graphitized carbon fibers are magnetically oriented in the direction perpendicular to the sheet. Although the sheets of Comparisons 7–10 have the graphitized carbon fibers as in the sheets of Examples 6–12, the sheets of Comparisons 7–10 were not place in the magnetic field. Therefore, the graphitized carbon fibers were not oriented in the direction perpendicular to the sheet. The thermal conductivity in the direction perpendicular to the sheet of the sheets of Examples 6–12 was improved compared with the sheets of Comparisons 7–10 because of magnetic application.

It should be apparent to those skilled in the art that the present invention may be embodied in many other specific forms without departing from the spirit or scope of the invention. Particularly, it should be understood that the invention may be embodied in the following forms.

The thermally conductive polymer sheet 13 may be used for the supporting member 14a and the radiator 14 of FIG. 1, the heat sink 15 of FIG. 3, and the housing 17 of FIG. 4.

The thermally conductive sheet 13 of the FIGS. 2 and 3 may be replaced with the thermally conductive adhesive or the thermally conductive grease.

Therefore, the present examples and embodiments are to be considered as illustrative and not restrictive and the invention is not to be limited to the details given herein, but may be modified within the scope and equivalence of the appended claims.

What is claimed is:

1. A thermally conductive polymer sheet comprising:
   a polymer matrix; and
   graphitized carbon fibers, which are a thermally conductive filler, wherein the fibers are obtained by spinning, infusibilizing, carbonizing, pulverizing, and then graphitizing mesophase pitch, wherein the fibers have a coating layer of a ferromagnetic material, and wherein the fibers are oriented to be perpendicular to the sheet.

2. The thermally conductive polymer sheet in accordance with claim 1, wherein the graphitized carbon fibers have an interplanar spacing (d002) of graphite planes of from 0.3354 nm to less than 0.3370 nm and a ratio (P101/P100) of diffraction peak (101) to diffraction peak (100) of from 1.15 to 3 by X-ray diffractometry.

3. The thermally conductive polymer sheet in accordance with claim 1, wherein the ferromagnetic material is at least one of a metal, an alloy, or a compound selected from the group consisting of nickel, cobalt and iron.

4. The thermally conductive polymer sheet in accordance with claim 2, wherein the ferromagnetic material is at least one of a metal, an alloy, or a compound selected from the group consisting of nickel, cobalt and iron.

5. The thermally conductive polymer sheet in accordance with claim 1, wherein the carbonization is conducted substantially at 250–1500 degrees C. in an inert gas.

6. The thermally conductive polymer sheet in accordance with claim 1, wherein the coating layer has a thickness of 0.01–5 μm.

7. The thermally conductive polymer sheet in accordance with claim 1, wherein the coating layer is electrically insulative.

8. The thermally conductive polymer sheet in accordance with claim 1, wherein the graphitized carbon fibers have a diameter of 5–20 μm.

9. The thermally conductive polymer sheet in accordance with claim 1, wherein the graphitized carbon fibers have an average particle size of 10–500 μm.

10. The thermally conductive polymer sheet in accordance with claim 1, wherein the graphitized carbon fibers are oriented by a magnetic field producing device at the magnetic flux density of at least 0.05 tesla so that the magnet line of force are perpendicular to the sheet.

11. The thermally conductive polymer sheet in accordance with claim 1, the graphitization is conducted by heating the pulverized carbon fibers at least 2500 degree C. in an inert gas.

* * * * *